United States Patent
Kaneda

(10) Patent No.: US 10,843,972 B2
(45) Date of Patent: Nov. 24, 2020

(54) CERAMIC ELECTRONIC DEVICE, TESTING DEVICE OF CERAMIC ELECTRONIC DEVICE, TESTING METHOD OF CERAMIC ELECTRONIC DEVICE AND MANUFACTURING METHOD OF CERAMIC ELECTRONIC DEVICE

(71) Applicant: TAIYO YUDEN CO., LTD., Tokyo (JP)

(72) Inventor: Kazumi Kaneda, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 100 days.

(21) Appl. No.: 16/115,279

(22) Filed: Aug. 28, 2018

(65) Prior Publication Data
US 2019/0071357 A1 Mar. 7, 2019

(30) Foreign Application Priority Data
Sep. 7, 2017 (JP) .................. 2017-172553

(51) Int. Cl.
*C04B 35/00* (2006.01)
*C04B 35/468* (2006.01)
(Continued)

(52) U.S. Cl.
CPC .......... *C04B 35/4682* (2013.01); *B32B 18/00* (2013.01); *C04B 35/64* (2013.01); *G01R 31/64* (2020.01); *G06T 7/001* (2013.01); *H01G 4/005* (2013.01); *H01G 4/1227* (2013.01); *H01G 4/30* (2013.01); *H01G 4/40* (2013.01); *C04B 2235/3206* (2013.01); *C04B 2235/3224* (2013.01); *C04B 2235/3239* (2013.01);
(Continued)

(58) Field of Classification Search
CPC ............... C04B 35/4682; C04B 35/64; C04B 2237/346; C04B 2237/565; C04B 2235/79; C04B 2237/704; C04B 2235/6581; C04B 2235/3262; C04B 2235/3239; C04B 2235/663; C04B 2235/3418; C04B 2235/3206; C04B 2235/3224; G01R 31/64; H01G 4/40; H01G 4/005; H01G 4/30; H01G 4/1227; B32B 18/00; G06T 7/001; G06T 2207/10061; G06T 2207/30164
See application file for complete search history.

(56) References Cited

U.S. PATENT DOCUMENTS

2009/0207554 A1 8/2009 Iguchi et al.
2009/0310276 A1* 12/2009 Tashima .............. H01G 4/012
361/303
(Continued)

FOREIGN PATENT DOCUMENTS

JP 2009200168 A 9/2009
JP 4660940 B2 3/2011
JP 2014022722 A 2/2014

*Primary Examiner* — Neil R McLean
(74) *Attorney, Agent, or Firm* — Law Office of Katsuhiro Arai

(57) ABSTRACT

A ceramic electronic device includes: a ceramic body that has a first face and a second face facing with the first face and has an internal electrode layer inside thereof; a pair of external electrodes that cover the first face and the second face; and a spot that is formed on a third face of the ceramic body that is different from the first face and the second face and is an amorphous phase including Ba, Si and O.

9 Claims, 6 Drawing Sheets

(51) Int. Cl.

| | | |
|---|---|---|
| *H01G 4/12* | (2006.01) | |
| *H01G 4/30* | (2006.01) | |
| *H01G 4/005* | (2006.01) | |
| *C04B 35/64* | (2006.01) | |
| *G06T 7/00* | (2017.01) | |
| *B32B 18/00* | (2006.01) | |
| *H01G 4/40* | (2006.01) | |
| *G01R 31/64* | (2020.01) | |

(52) U.S. Cl.
CPC .......... *C04B 2235/3262* (2013.01); *C04B 2235/3418* (2013.01); *C04B 2235/6581* (2013.01); *C04B 2235/663* (2013.01); *C04B 2235/79* (2013.01); *C04B 2237/346* (2013.01); *C04B 2237/565* (2013.01); *C04B 2237/704* (2013.01); *G06T 2207/10061* (2013.01); *G06T 2207/30164* (2013.01)

(56) References Cited

U.S. PATENT DOCUMENTS

| | | | |
|---|---|---|---|
| 2012/0153516 A1* | 6/2012 | Fuji | B29C 39/006 264/1.36 |
| 2014/0020942 A1 | 1/2014 | Cho et al. | |
| 2014/0301014 A1* | 10/2014 | Kim | H01G 4/30 361/301.4 |
| 2016/0351335 A1* | 12/2016 | Kato | H01G 4/30 |

* cited by examiner

CERAMIC ELECTRONIC DEVICE, TESTING DEVICE OF CERAMIC ELECTRONIC DEVICE, TESTING METHOD OF CERAMIC ELECTRONIC DEVICE AND MANUFACTURING METHOD OF CERAMIC ELECTRONIC DEVICE

CROSS-REFERENCE TO RELATED APPLICATION

This application is based upon and claims the benefit of priority of the prior Japanese Patent Application No. 2017-172553, filed on Sep. 7, 2017, the entire contents of which are incorporated herein by reference.

FIELD

A certain aspect of the present invention relates to a ceramic electronic device, a testing device of a ceramic electronic device, a testing method of a ceramic electronic device, and a manufacturing method of a ceramic electronic device.

BACKGROUND

In ceramic electronic devices such as multilayer ceramic capacitors, varistors or thermistors, internal electrode layers are provided in a ceramic body of a rectangular parallelepiped shape, and external electrodes are provided on facing two edge faces. In the ceramic electronic devices, it is preferable that quality of a product, identification of a specific face and so on can be determined on the basis of an external view. That is, it is preferable that necessary information is obtained from the external view of the ceramic electronic devices. And so, there are disclosed technologies for identifying the external view (see Japanese Patent Application Publication No. 2009-200168 and Japanese Patent Application Publication No. 2014-22722).

SUMMARY OF THE INVENTION

However, the ceramic electronic devices may need a new component for a visual inspection, and a manufacturing process may be complicated.

The present invention has a purpose of providing a ceramic electronic device, a testing device of a ceramic electronic device, a testing method of a ceramic electronic device and a manufacturing method of a ceramic electronic device.

According to an aspect of the present invention, there is provided a ceramic electronic device including: a ceramic body that has a first face and a second face facing with the first face and has an internal electrode layer inside thereof; a pair of external electrodes that cover the first face and the second face; and a spot that is formed on a third face of the ceramic body that is different from the first face and the second face and is an amorphous phase including Ba, Si and O.

According to another aspect of the present invention, there is provided a testing device of a ceramic electronic device including: a storage configured to store a standard of the spot formed on the third face of the ceramic electronic device; an imaging device configured to capture an image of an object ceramic electronic device for testing; and a testing unit configured to test the object ceramic electronic device by comparing the image captured by the imaging device with the standard stored in the storage.

According to another aspect of the present invention, there is provided a testing method of a ceramic electronic device including: storing a standard of a spot in s storage, the spot being formed on the third dace of the ceramic electronic device; capturing an image of a ceramic electronic device that is an object for testing, with an imaging device; and testing the ceramic electronic device by comparing the image captured by the imaging device with the standard stored in the storage.

According to another aspect of the present invention, there is provided a manufacturing method of a ceramic electronic device including: forming a parallelepiped ceramic multilayer structure by alternately stacking each of dielectric green sheets and each of conductive pastes for forming an internal electrode so that the conductive pastes are alternately exposed to two facing edge faces of the ceramic multilayer structure, and providing cover sheets as outermost layers of the ceramic multilayer structure, a main component ceramic of the cover sheets being the same as a main component ceramic of the dielectric green sheets; and baking the ceramic multilayer structure, wherein: the main component ceramic having a perovskite structure expressed by a general formula of $ABO_3$ includes Ba as an A site element, in at least one of the dielectric green sheets and the cover sheets; 0.1 atm % to 0.35 atm % of V, 0.5 atm % to 0.8 atm % of Si, 0.07 atm to 0.25 atm % of Mn, 0.6 atm % to 0.9 atm % of Ho and 0.5 atm % to 0.7 atm % of Mg are added to the main component ceramic on a presumption that a B site element of the main component ceramic is 100 atm %; and an A/B ratio is 0.9985 to 1.0015, the A/B ratio being a molar ratio of the A site element and the B site element.

DETAILED DESCRIPTION

A description will be given of an embodiment with reference to the accompanying drawings.

First Embodiment

Figure 1:
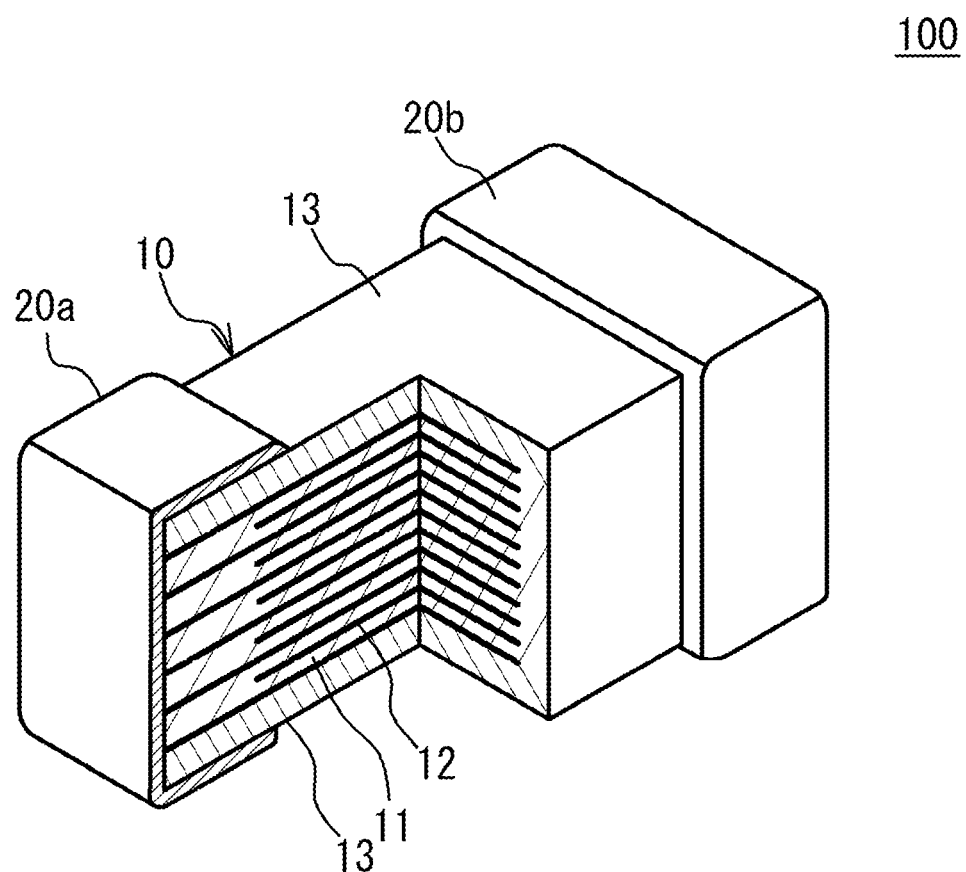
FIG. 1 illustrates a partial perspective view of a multilayer ceramic capacitor.

A description will be given of a multilayer ceramic capacitor. FIG. 1 illustrates a partial perspective view of a multilayer ceramic capacitor 100. As illustrated in FIG. 1, the multilayer ceramic capacitor 100 includes a multilayer chip 10 having a rectangular parallelepiped shape, and a pair of external electrodes 20a and 20b that are respectively provided at two edge faces of the multilayer chip 10 facing each other. The external electrodes 20a and 20b extend to four faces other than the edge faces of the multilayer chip 10.

However, the external electrodes 20a and 20b are spaced from each other on the four faces.

The multilayer chip 10 has a structure designed to have dielectric layers 11 and internal electrode layers 12 alternately stacked. A main component of the dielectric layers 11 is a ceramic material acting as a dielectric material. A main component of the internal electrode layers 12 is a metal material such as a base metal material. End edges of the internal electrode layers 12 are alternately exposed to a first edge face of the multilayer chip 10 and a second edge face of the multilayer chip 10 that is different from the first edge face. In the embodiment, the first face faces with the second face. The external electrode 20a is provided on the first edge face. The external electrode 20b is provided on the second edge face. Thus, the internal electrode layers 12 are alternately conducted to the external electrode 20a and the external electrode 20b. Thus, the multilayer ceramic capacitor 100 has a structure in which a plurality of dielectric layers 11 are stacked and each two of the dielectric layers 11 sandwich the internal electrode layer 12. In a multilayer structure of the dielectric layers 11 and the internal electrode layers 12, the internal electrode layer 12 is positioned at an outermost layer in the stacking direction. The upper face and the lower face of the multilayer structure that are the internal electrode layers 12 are covered by cover layers 13. A main component of the cover layers 13 is the same as the main component of the dielectric layers 11. In other words, the cover layers 13 are outermost dielectric layers of the multilayer chip 10 in the stacking direction. In the multilayer chip 10, two faces other than the two edge faces, an upper face and a lower face are referred to as two side faces.

For example, the multilayer ceramic capacitor 100 may have an external size of a length of 0.25 mm±0.015 mm, a width of 0.125 mm±0.015 mm and a height of 0.125 mm 0.015 mm. The multilayer ceramic capacitor 100 may have an external size of a length of 0.4 mm±0.02 mm, a width of 0.2 mm±0.02 mm and a height of 0.2 mm±0.02 mm. The multilayer ceramic capacitor 100 may have an external size of a length of 0.6 mm, a width of 0.3 mm and a height of 0.3 mm. The multilayer ceramic capacitor 100 may have an external size of a length of 1.0 mm, a width of 0.5 mm and a height of 0.5 mm. The multilayer ceramic capacitor 100 may have an external size of a length of 3.2 mm, a width of 1.6 mm and a height of 1.6 mm. The multilayer ceramic capacitor 100 may have an external size of a length of 4.5 mm, a width of 3.2 mm and a height of 2.5 mm. These sizes are external sizes including the external electrodes. However, the size of the multilayer ceramic capacitor 100 is not limited. As described later, electronic characteristic is determined from the external view. Therefore, a handling for contacting a measuring terminal with a product is not needed. In particular, when the product gets smaller, it is possible to easily test the product. When the size of the longitudinal direction (the largest direction of the product) is 0.1 mm to 0.23 mm, it is possible to test the product more easily.

A main component of the internal electrode layers 12 is a base metal such as nickel (Ni), copper (Cu), tin (Sn) or the like. The internal electrode layers 12 may be made of a noble metal such as platinum (Pt), palladium (Pd), silver (Ag), gold (Au) or alloy thereof. A thickness of the internal electrode layers 12 is, for example, 0.5 μm or less. It is preferable that the thickness of the internal electrode layers 12 is 0.3 μm or less. The dielectric layers 11 are mainly composed of a ceramic material that is expressed by a general formula $ABO_3$ and has a perovskite structure. The perovskite structure includes $ABO_{3-\alpha}$ having an off-stoichiometric composition. For example, the ceramic material is such as $BaTiO_3$ (barium titanate), $CaZrO_3$ (calcium zirconate), $CaTiO_3$ (calcium titanate), $SrTiO_3$ (strontium titanate), $Ba_{1-x-y}Ca_xSr_yTi_{1-z}Zr_zO_3$ ($0 \leq x \leq 1$, $0 \leq y \leq 1$, $0 \leq z \leq 1$) having a perovskite structure.

Figure 2:
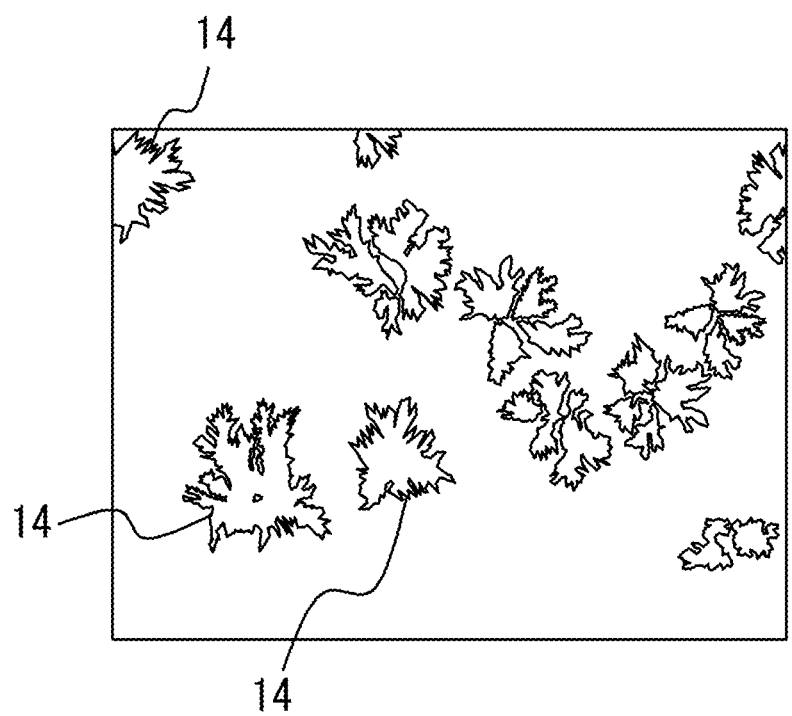
FIG. 2 illustrates a spot.

As illustrated in FIG. 2, a spot 14 is formed on at least one of the upper face, the lower face and the two side faces of the multilayer chip 10. The spot 14 includes Ba, Si and O and is an amorphous phase. For example, a main component of the amorphous phase including Ba, Si and O is barium silicate ($BaSiO_3$). As illustrated in FIG. 2, the spot 14 does not cover the whole of the upper face, the lower face and the two side faces of the multilayer chip 10. The spot 14 is sparsely formed.

The spot 14 is an amorphous phase. Therefore, a reflection of the spot 14 is different from that of the main component ceramic of the dielectric layers 11. It is therefore possible to find the spot 14 by an eyesight through a naked eye or a microscope. Accordingly, it is possible to use the spot 14 as information of the multilayer ceramic capacitor 100. In this case, even if an electrical characteristic test is not performed, it is possible to test the multilayer ceramic capacitor 100. Therefore, the testing process is simplified. For example, it is possible to test a slight gap of electrical characteristic that is difficult to test in the electrical characteristic test. Although details will be described in a manufacturing method, components of the amorphous phase are included in the multilayer ceramic capacitor 100. Therefore, the multilayer ceramic capacitor 100 does not need a new component. Accordingly, it is possible to easily test the external view of the multilayer ceramic capacitor 100.

For example, when the dielectric layers 11 and the internal electrode layers 12 are formed by baking, a small amount of additive is added to the dielectric layers 11 and the internal electrode layers 12. The shape, the size, the number, the color and so on of the spot 14 is determined in accordance with a type or an amount of the additive. Therefore, when the shape, the size, the number, the color and so on of the spot 14 are confirmed, it is possible to confirm the type, the amount or the like of the additive to the dielectric layers 11 and the internal electrode layers 12. The shape, the size, the number, the color and so on of the spot 14 are determined in accordance with the temperature, the atmosphere, the period and so on of the baking. It is therefore possible to confirm the baking condition by confirming the shape, the size, the number, the color and so on of the spot 14. For example, a large number of the multilayer ceramic capacitors 100 are manufactured in advance in which the type of the additive, the amount of the additive, the baking condition and so on are changed. Standard information such as the shape, the size, the number, the color or the like the spot 14 in this case are stored in a database as enrolled data. In this case, it is possible to confirm the type of the additive, the amount of the additive, the baking condition or the like of the object product for the test by comparing the spot 14 of the object for the test with the enrolled data. It is therefore possible to determine whether the object product for the test satisfies the design. For example, it is possible to determine whether the manufacturing condition has a mistake, whether a product or another lot is mixed, or the like.

In order to find the spot 14 by naked eyes, it is preferable that the spot 14 has a predetermined size. For example, it is preferable that an average diameter of the spot 14 is three times or more than an average crystal grain diameter of the main component ceramic of the face on which the spot 14 is formed. For example, when the average crystal grain diameter of the main component ceramic of a face on which the spot 14 is formed is approximately 1 µm, it is preferable that the average diameter of the spot 14 is 3 µm or more. On the other hand, when the spot 14 is excessively large, an area of the spot 14 covering the multilayer chip 10 is excessively large and it is difficult to find the spot 14. Alternatively, it may be difficult to confirm the sintered structure of the dielectric layers 11 and the cover layers 13. And so, it is preferable that the average diameter of the spot 14 is 30 µm or less.

It is preferable that the spot 14 is formed on all of the upper face, the lower face and the two side faces of the multilayer chip 10. In this case, when the multilayer ceramic capacitor 100 is arranged on a base, the spot 14 is formed on a face which a person finds with his naked eyes. Therefore, even if a direction of the multilayer ceramic capacitor 100 is not corrected to a predetermined direction, the person can find the spot 14 by using an image testing device.

Figure 3A:
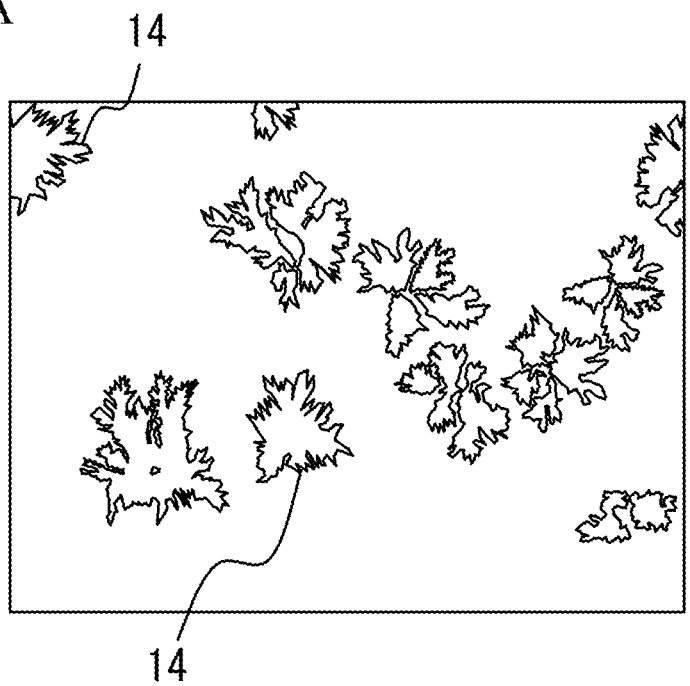
FIG. 3A illustrates a spot of which an average diameter is large.
Figure 3B:
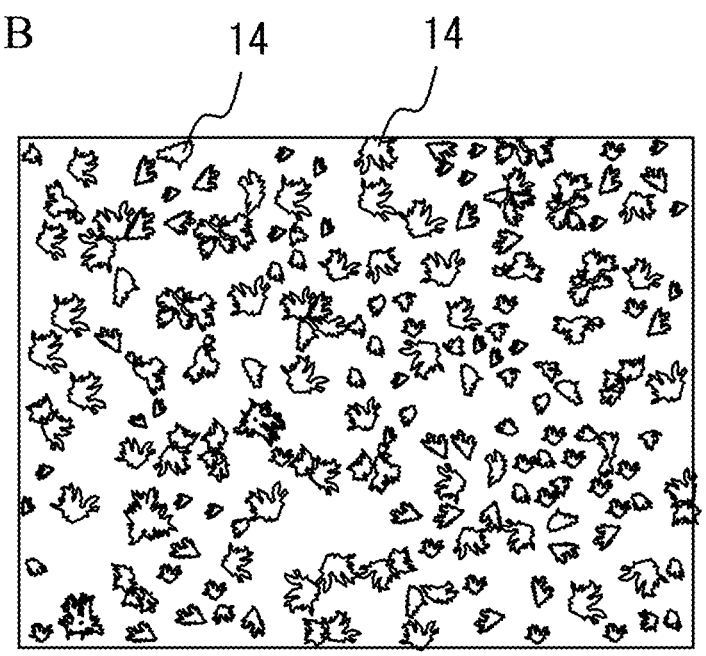
FIG. 3B illustrates a spot of which an average diameter is small.

When the spot 14 is formed on all of the four faces, it is preferable that two average diameters of the spot 14 of two facing faces are different from each other. In this case, when a difference of the average diameters is confirmed, the person can identify the two facing faces. For example, FIG. 3A illustrates the spot 14 of which the average diameter is large. FIG. 3B illustrates the spot 14 of which the average diameter is small. The surface of the multilayer chip 10 is observed by a metal microscope or a SEM in a field in which approximately 50 numbers of the spot 14 can be observed. Diameters of longitudinal directions of the spots 14 are measured. The diameters may be treated as diameter of circles. An average of the diameter may be treated as the average diameter.

The spot 14 may be formed on only predetermined one or more faces. For example, the spot 14 may be formed only on a pair of the cover layers 13. In this case, it is possible to confirm that a face on which the spot 14 is formed is the cover layer 13 in the multilayer chip 10. Therefore, it is possible to find the stacking direction of the multilayer chip 10. Alternatively, the spot 14 may be formed only on one of the pair of the cover layers 13. In this case, when the existence of the spot 14 is confirmed, it is possible to identify each of the pair of the cover layers 13.

Figure 4:
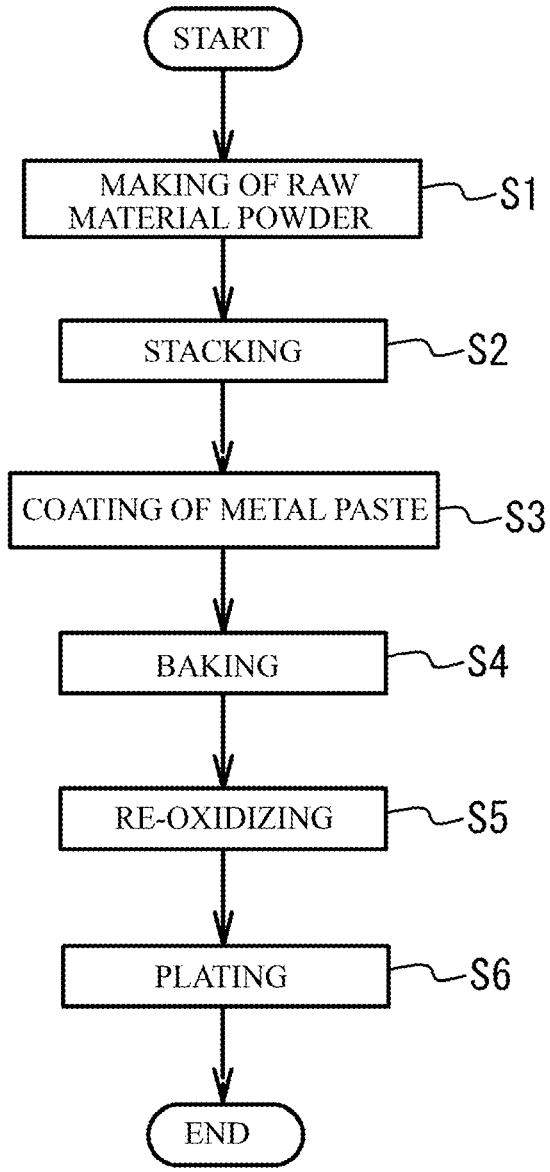
FIG. 4 illustrates a manufacturing method of a multilayer ceramic capacitor.

Next, a description will be given of a manufacturing method of the multilayer ceramic capacitor 100. FIG. 4 illustrates a manufacturing method of the multilayer ceramic capacitor 100.

(Making process of a raw material powder) Additive compound may be added to ceramic powder material of the dielectric layers 11, in accordance with purposes. The additive compound may be an oxide of Mg (magnesium), Mn (manganese), V (vanadium), Cr (chromium) or a rare earth element (Y (yttrium), Sm (samarium), Eu (europium), Gd (gadolinium), Tb (terbium), Dy (dysprosium), Ho (holmium), Er (erbium), Tm (thulium) and Yb (ytterbium)), or an oxide of Co (cobalt), Ni, Li (lithium), B (boron), Na (sodium), K (potassium) and Si (silicon), or glass. Compound including additive compound is mixed with the ceramic material powders. The resulting ceramic powders are calcined. Then, the ceramic powders are wet-blended with the additive compound. After that, the ceramic powders with the additive compound are dried and crushed. And, desirable ceramic powder is prepared. With the same method, it is possible to prepare a cover material described later.

In the embodiment, in the making of the dielectric material, at least an oxide of Si, an oxide of V, an oxide of Mn, an oxide of Ho and an oxide of Mg as additives are added. For example, it is preferable that 0.1 atm % to 0.35 atm % of V, 0.5 atm % to 0.8 atm % of Si, 0.07 atm % to 0.25 atm % of Mn, 0.6 atm % to 0.9 atm % of Ho and 0.5 atm % to 0.7 atm % of Mg are added to the main component ceramic on a presumption that B site element of the main component ceramic is 100 atm %. It is preferable that an A/B ratio that is a molar ratio of the A site element and the B site element is 0.9985 to 1.0015 in the dielectric material.

In the making of the cover material, at least an oxide of Si, an oxide of V, an oxide of Mn, an oxide of Ho and an oxide of Mg as additives are added. For example, it is preferable that 0.1 atm % to 0.35 atm % of V, 0.5 atm % to 0.8 atm % of Si, 0.07 atm % to 0.25 atm % of Mn, 0.6 atm % to 0.9 atm % of Ho and 0.5 atm % to 0.7 atm % of Mg are added to the main component ceramic on a presumption that B site element of the main component ceramic is 100 atm %. It is preferable that an A/B ratio that is a molar ratio of the A site element and the B site element is 0.9985 to 1.0015 in the cover material.

(Stacking Process) Next, a binder such as polyvinyl butyral (PVB) resin, an organic solvent such as ethanol or toluene, and a plasticizer are added to the resulting dielectric material and are wet-blended. With use of the resulting slurry, a strip-shaped dielectric green sheet with a thickness of 0.8 µm or less is coated on a base material such as PET (polyethylene telephthalate) by, for example, a die coater method or a doctor blade method, and then dried.

Then, a pattern of the internal electrode layer 12 is provided on the surface of the dielectric green sheet by printing conductive pastes for forming an internal electrode with use of screen printing or gravure printing. The conductive pastes include powders of a main component metal of the internal electrode layers 12, a binder, an solvent and additives if necessary. It is preferable that the binder and the solvent are different from those of the ceramic slurry. The ceramic material that is the main component of the dielectric layers 11 and acts as the co-material may be dispersed into the conductive paste.

Next, a binder such as polyvinyl butyral (PVB) resin, an organic solvent such as ethanol or toluene, and a plasticizer are added to the resulting cover material and are wet-blended. With use of the resulting slurry, a strip-shaped dielectric cover sheet with a thickness of 10 µm or less is coated on a base material such ash PET by, for example, a die coater method or a doctor blade method, and then dried.

Then, the dielectric green sheet on which the internal electrode layer pattern is printed is stamped into a predetermined size, and a predetermined number (for example, 200 to 500) of stamped dielectric green sheets are stacked while the base material is peeled so that the internal electrode layers 12 and the dielectric layers 11 are alternated with each other and the end edges of the internal electrode layers 12 are alternately exposed to both end faces in the length direction of the dielectric layer so as to be alternately led out to a pair of external electrodes of different polarizations. A predetermined number (for example, 2 to 10) of cover sheets, which are to be the cover layers 13, are stacked on the stacked green sheets and under the stacked sheets and are thermally compressed. The resulting compact is cut into a predetermined size (for example, 1.0 mm×0.5 mm). The cover material for the cover sheet may be the same as the dielectric material mentioned above.

(coating of metal paste) The binder is removed from the ceramic multilayer structure obtained by the stacking process in $N_2$ atmosphere of a temperature range of 250 degrees C. to 500 degrees C. After that, a metal paste including a metal filler, a co-material, a binder and a solvent is coated from the edge faces to the four side faces of the ceramic multilayer structure and is dried. The metal paste is a metal paste for forming the external electrodes.

(Baking Process) The ceramic multilayer structure on which the metal paste for forming the external electrodes is coated is baked for 1 hour to 2 hours in a reductive atmosphere having an oxygen partial pressure of $10^{-10}$ to $10^{-11}$ atm in a temperature range of 1170 degrees C. to 1220 degrees C. Thus, a sintered structure is obtained. The sintered structure has the multilayer chip 10 in which each of the dielectric layers 11 and each of the internal electrode layers 12 are alternately stacked, the cover layers 13 that are formed as outermost layers of the sintered structure in the stacking direction, and ground layers of the external electrodes 20a and 20b.

In the embodiment, it is thought that, in the baking process, a liquid phase including Ba and Si is diffused into the upper face, the lower face and the two side faces of the multilayer chip 10. In addition, it is thought that V, Mn, Ho and Mg are diffused together with the liquid phase in accordance with the amount of V, Mn, Ho and Mg. It is therefore form the spot 14 of the amorphous phase including Ba, Si and O of which the main component is barium silicate, on the upper face, the lower face and the two side faces of the multilayer chip 10.

When the amount of Si, V, Mn, Ho and Mg, and the oxygen partial pressure, the temperature, the baking time or the like of the baking process are adjusted, the shape, the size, the number, the color or the like of the spot 14 can be adjusted. As methods of enlarging the average diameter of the spot 14 and enlarging the number of the spot 14, there may be methods of making strong reductive atmosphere in the baking process, increasing the baking temperature, elongating the baking time, adjusting a balance of the composition (for example, the maximum amount of the additive is near a median value) and so on. As methods of lowering the average diameter of the spot 14 and lowering the number of the spot 14, there may be methods of making weak reductive atmosphere in the baking process, lowering the baking temperature, shortening the baking time, adjusting the balance of the composition (any one of the compositions is near an upper limit or a lower limit) and so on.

When at least one of Si, V, Mn, Ho and Mg is not added to a face of the multilayer chip 10, the spot 14 is not formed on the face. Alternately, at least one of the amounts of Si, V, Mn, Ho and Mg is out of the above-mentioned preferable range on a face of the multilayer chip 10, the spot 14 is not formed on the face. For example, when at least one of Si, V, Mn, Ho and Mg is not added to the cover material of the cover sheet used for the upper face or at least one of the amounts of Si, V, Mn, Ho and Mg is out of the above-mentioned preferable range, the spot 14 is not formed on the cover layer 13 acting as the upper face of the multilayer chip 10. When at least one of Si, V, Mn, Ho and Mg is not added to the dielectric material or at least one of the amounts of Si, V, Mn, Ho and Mg is out of the above-mentioned preferable range, the spot 14 is not formed on the two side faces of the multilayer chip 10.

(Re-oxidizing process) After that, the sintered structure may be subjected to a re-oxidizing process in $N_2$ gas atmosphere in a temperature range of 600 degrees C. to 1000 degrees C.

(Plating process) After that, with a plating process, a metal such as Cu, Ni, and Sn may be coated on the ground layers of the external electrodes 20a and 20b in this order. With the processes, the multilayer ceramic capacitor 100 is manufactured.

In the manufacturing method of the embodiment, when the composition of the dielectric material and the cover material is adjusted, it is possible to form the spot 14 on at least one of the two side faces, the upper face and the lower face of the multilayer chip 10. As mentioned above, when Si, V, Mn, Ho and Mg are added to at least one of the dielectric material and the cover material, it is possible to form the spot 14.

It is possible to change the shape, the size, the number, the color and so on of the spot 14 by changing the surface condition of the cover sheet before the baking. In concrete, the cover sheet before the baking is coated on a base such as PET. The surface condition such as a surface roughness of the face on the PET side is different from that of the face opposite to the PET. It is possible to change the shape, the size, the number, the color and so on of the spot 14 in accordance with the difference of the surface conditions. And so, it is possible to change the shape, the size, the number, the color and so on of the spot 14 on the upper face and the lower face of the multilayer chip 10, when the face on the PET side of the cover sheet on the upper face side of the multilayer chip 10 is exposed and the face opposite to the PET of the cover sheet on the lower face side of the multilayer chip 10 is exposed.

Second Embodiment

Figure 5A:
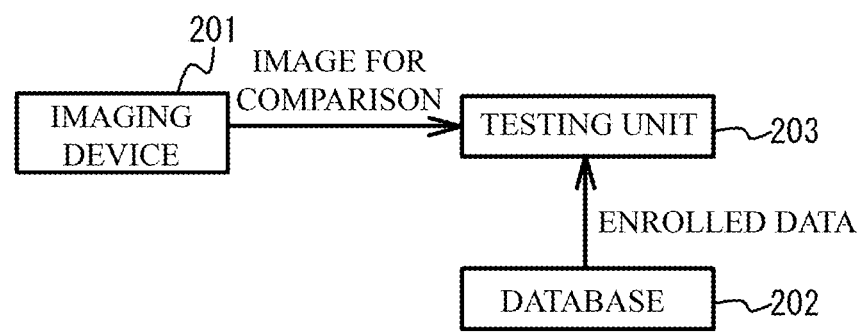
FIG. 5A illustrates a function block diagram of a testing device.

In a second embodiment, a description will be given of a testing device 200. FIG. 5A illustrates a function block diagram of the testing device 200. As illustrated in FIG. 5A, the testing device 200 has an imaging device 201, a database 202, a testing unit 203 and so on. The imaging device 201 is a camera such as a CCD (Charged-Coupled Device) camera or a CMOS (Complementary Metal Oxide Semiconductor) camera. The database 202 stores a standard of the spot 14 as enrolled data which is formed on at least one of the upper face, the lower face and the two side faces of the multilayer chip 10 of a good product.

Figure 5B:
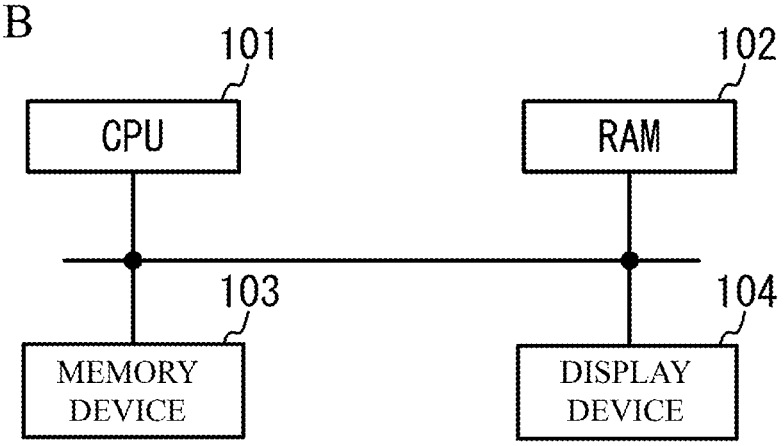
FIG. 5B illustrates a block diagram of a hardware structure of a database and a testing unit.

FIG. 5B illustrates a block diagram of a hardware structure of the database 202 and the testing unit 203. As illustrated in FIG. 5B, the database 202 and the testing unit 203 have a CPU 101, a RAM 102, a memory device 103, a display device 104 and so on. These components are coupled to each other with a bus or the like. The CPU 101 is a central processing unit. The CPU 101 includes one or more core. The RAM (Random Access Memory) 102 is a volatile memory temporally storing a program executed by the CPU 101, a data processed by the CPU 101, and so on. The memory device 103 is a nonvolatile memory device. The memory device 103 may be a SSD (Solid State Drive) such as a ROM (Read Only Memory) or a flash memory, or a hard disk driven by a hard disk drive. The display device 104 is such as a liquid crystal display or an electroluminescence panel, and displays results of testing described later. The testing program stored in the memory device 103 is developed into the RAM 102. The CPU 101 executes the testing program stored in the memory device 103. Thus, the database and the testing unit 203 are established.

Figure 6:
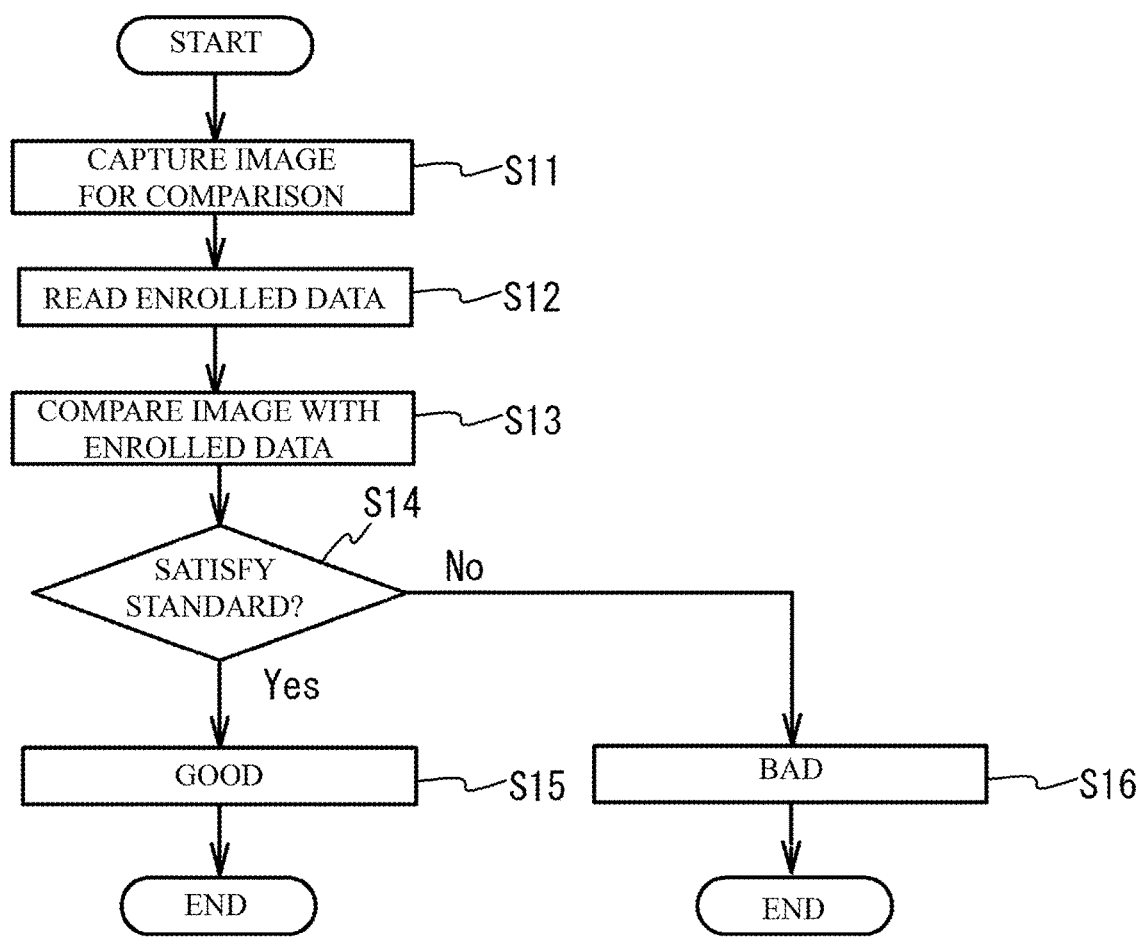
FIG. 6 illustrates a flowchart which a testing unit executes during a testing process.

FIG. 6 illustrates a flowchart which the testing unit 302 executes during a testing process. As illustrated in FIG. 6, the imaging device 201 captures an image for comparison of the multilayer ceramic capacitor 100 provided on a base or the like and sends the image to the testing unit 203 (Step S11). Next, the testing unit 203 reads the enrolled data stored in the database 202 (Step S12).

The testing unit 203 compares the image for comparison captured in Step S11 with the enrolled data read in Step S12

(Step S13). For example, the enrolled data is standard information of the existence, the shape, the size, the number or the color of the spot 14. Alternatively, the enrolled data is a standard image of a face on which the spot 14 is formed.

Next, the testing unit 203 determines whether the image for comparison satisfies the standard of the enrolled data (Step S14). For example, it is determined whether the spot 14 of the image for comparison satisfies the standard information. In concrete, it is determined whether the spot 14 of the image for comparison satisfies a standard range such as an average diameter included in the standard information. Alternatively, it is determined whether a similarity degree between the image for comparison and the standard image is a threshold or more. When it is determined as "Yes" in Step S14, the testing unit 203 determines the multilayer ceramic capacitor 100 is a good product (Step S15). When it is determined as "No" in Step S14, the testing unit 203 determines that the multilayer ceramic capacitor 100 is a bad product (Step S16).

In the embodiment, the existence, the shape, the size, the number or the color of the spot 14 can be used as the standard information of the multilayer ceramic capacitor 100. Even if the test of the electrical characteristic is not performed, the testing can be performed. Therefore, the testing process is simplified. A component of a barium silicate is included in the multilayer ceramic capacitor 100. Therefore, the multilayer ceramic capacitor 100 does not need a new component. Therefore, in the embodiment, it is possible to easily test an external view.

When the existence, the shape, the size, the number or the color of the spot 14 in a case where the multilayer ceramic capacitor 100 in a plurality of manufacturing conditions including different types of the additive, the amount of the additive, and the baking condition are made is stored in the database 202, as the enrolled data. In this case, it is possible to determine the type of the multilayer ceramic capacitor 100 that is an object for testing. It is possible to determine whether the multilayer ceramic capacitor 100 that is an object for testing is a product satisfying the design. For example, it is possible to confirm whether the manufacturing condition includes a mistake or a product of another lot is mixed.

In the embodiments, the multilayer ceramic capacitor is described as an example of ceramic electronic devices. However, the embodiments are not limited to the multilayer ceramic capacitor. For example, the embodiments may be applied to another electronic device such as varistor or thermistor.

EXAMPLES

The multilayer ceramic capacitors in accordance with the embodiment were made and the property was measured.

Necessary additive was added to barium titanate powders. The resulting powders were sufficiently wet-blended by a ball mil and were crushed. Thus, the dielectric material and the cover material were obtained. In an example 1, 0.25 atm % of V, 0.75 arm % of Si, 0.15 atm % of Mn, 0.7 atm % of Ho and 0.6 atm % of Mg were added to barium titanate on a presumption that Ti was 100 atm %. An A/B ratio was 1.0000. In an example 2, 0.10 atm % of V, 0.75 arm % of Si, 0.15 atm % of Mn, 0.7 atm % of Ho and 0.6 atm % of Mg were added to barium titanate on a presumption that Ti was 100 atm %. An A/B ratio was 1.0000. In an example 3, 0.35 atm % of V, 0.75 arm % of Si, 0.15 atm % of Mn, 0.7 atm % of Ho and 0.6 atm % of Mg were added to barium titanate on a presumption that Ti was 100 atm %. An A/B ratio was 1.0000. In an example 4, 0.25 atm % of V, 0.50 arm % of Si, 0.15 atm % of Mn, 0.7 atm % of Ho and 0.6 atm % of Mg were added to barium titanate on a presumption that Ti was 100 atm %. An A/B ratio was 1.0000. In an example 5, 0.25 atm % of V, 0.80 arm % of Si, 0.15 atm % of Mn, 0.7 atm % of Ho and 0.6 atm % of Mg were added to barium titanate on a presumption that Ti was 100 atm %. An A/B ratio was 1.0000. In an example 6, 0.25 atm % of V, 0.75 arm % of Si, 0.07 atm % of Mn, 0.7 atm % of Ho and 0.6 atm % of Mg were added to barium titanate on a presumption that Ti was 100 atm %. An A/B ratio was 1.0000. In an example 7, 0.25 atm % of V, 0.75 arm % of Si, 0.25 atm % of Mn, 0.7 atm % of Ho and 0.6 atm % of Mg were added to barium titanate on a presumption that Ti was 100 atm %. An A/B ratio was 1.0000. In an example 8, 0.25 atm % of V, 0.75 arm % of Si, 0.15 atm % of Mn, 0.6 atm % of Ho and 0.6 atm % of Mg were added to barium titanate on a presumption that Ti was 100 atm %. An A/B ratio was 1.0000. In an example 9, 0.25 atm % of V, 0.75 arm % of Si, 0.15 atm % of Mn, 0.9 atm % of Ho and 0.6 atm % of Mg were added to barium titanate on a presumption that Ti was 100 atm %. An A/B ratio was 1.0000. In an example 10, 0.25 atm % of V, 0.75 arm % of Si, 0.15 atm % of Mn, 0.7 atm % of Ho and 0.5 atm % of Mg were added to barium titanate on a presumption that Ti was 100 atm %. An A/B ratio was 1.0000. In an example 11, 0.25 atm % of V, 0.75 arm % of Si, 0.15 atm % of Mn, 0.7 atm % of Ho and 0.7 atm % of Mg were added to barium titanate on a presumption that Ti was 100 atm %. An A/B ratio was 1.0000. In an example 12, 0.25 atm % of V, 0.75 arm % of Si, 0.15 atm % of Mn, 0.7 atm % of Ho and 0.6 atm % of Mg were added to barium titanate on a presumption that Ti was 100 atm %. An A/B ratio was 0.9985. In an example 13, 0.25 atm % of V, 0.75 arm % of Si, 0.15 atm % of Mn, 0.7 atm % of Ho and 0.6 atm % of Mg were added to barium titanate on a presumption that Ti was 100 atm %. An A/B ratio was 1.0015. In a comparative example 1, 0.01 atm % of V, 0.75 arm % of Si, 0.15 atm % of Mn, 0.7 atm % of Ho and 0.6 atm % of Mg were added to barium titanate on a presumption that Ti was 100 atm %. An A/B ratio was 1.0000. In a comparative example 2, 0.25 atm % of V, 1.00 arm % of Si, 0.15 atm % of Mn, 0.7 atm % of Ho and 0.6 atm % of Mg were added to barium titanate on a presumption that Ti was 100 atm %. An A/B ratio was 1.0000. In a comparative example 3, 0.25 atm % of V, 0.75 arm % of Si, 0.50 atm % of Mn, 0.7 atm % of Ho and 0.6 atm % of Mg were added to barium titanate on a presumption that Ti was 100 atm %. An A/B ratio was 1.0000. In a comparative example 4, 0.25 atm % of V, 0.75 arm % of Si, 0.15 atm % of Mn, 0.1 atm % of Ho and 0.6 atm % of Mg were added to barium titanate on a presumption that Ti was 100 atm %. An A/B ratio was 1.0000. In a comparative example 5, 0.25 atm % of V, 0.75 arm % of Si, 0.15 atm % of Mn, 0.7 atm % of Ho and 0.1 atm % of Mg were added to barium titanate on a presumption that Ti was 100 atm %. An A/B ratio was 1.0000. In a comparative example 6, 0.25 atm % of V, 0.75 arm % of Si, 0.15 atm % of Mn, 0.7 atm % of Ho and 0.6 atm % of Mg were added to barium titanate on a presumption that Ti was 100 atm %. An A/B ratio was 1.0020.

An organic binder and a solvent were added to the dielectric material. And dielectric green sheets were made by a doctor blade method. A thickness of the dielectric green sheet was 0.8 μm. The organic binder was polyvinyl butyral (PVB) resin or the like. The solvent was ethanol, toluene or the like. And a plasticizer and so on were added.

Next, the conductive paste for forming the internal electrode layer was formed. The conductive paste included a main component metal (Ni) powder of the internal electrode layer 12, a co-material (barium titanate), a binder (ethyl cellulose), a solvent and an auxiliary as needed.

The conductive paste for forming the internal electrode layer was screen-printed on the dielectric green sheet. 250 of the dielectric green sheets on which the conductive paste for forming the internal electrode layer was printed were stacked, and cover sheets were stacked on the stacked dielectric green sheets and under the stacked dielectric green sheets. After that, a ceramic multilayer structure was obtained by a thermal compressing. And the ceramic multilayer structure was cut into a predetermined size.

The binder was removed from the ceramic multilayer structure in $N_2$ atmosphere. After that, the metal paste including the metal filler of which a main component was Ni, the co-material, the binder and the solvent was coated from the both edge faces to the side faces of the ceramic multilayer structure and was dried. After that, the resulting ceramic multilayer structure was baked together with the metal paste for 1 hour to 2 hours in a reductive atmosphere of $10^{-10}$ atm to $10^{-11}$ atm in a temperature range of 1170 degrees C. to 1220 degrees C. And, a sintered structure was formed.

The resulting sintered structure had a length of 0.6 mm, a width of 0.3 mm and a height of 0.3 mm. The sintered structure was subjected to a re-oxidation process at 800 degrees C. in $N_2$ atmosphere. After that, by a plating process, a Cu-plated layer, a Ni-plated layer and a Sn-plated layer were formed on a surface of a ground layer of the external electrodes 20a and 20b. And, the multilayer ceramic capacitor 100 was obtained.

(Analysis) The existence of the spot was confirmed by observing the upper face, the lower face and the two side faces of the multilayer chip 10. Table 1 shows the results. As shown in Table 1, in the examples 1 to 13, the spot 14 was found on the upper face, the lower face and the two side faces of the multilayer chip 10. It is thought that this was because 0.1 atm % to 0.35 atm % of V, 0.5 atm % to 0.8 atm % of Si, 0.07 atm % to 0.25 atm % of Mn, 0.6 atm % to 0.9 atm % of Ho, 0.5 atm % to 0.7 atm % of Mg were added to barium titanate that is a main component ceramic of the dielectric material and the cover material on a presumption that Ti of the barium titanate was 100 atm %, and the A/B ratio was 0.9985 to 1.0015, in the making process of the dielectric material and the cover material.

TABLE 1

|  | V (atm %) | Si (atm %) | Mn (atm %) | Ho (atm %) | Mg (atm %) | A/B RATIO | EXISTENCE OF SPOT |
|---|---|---|---|---|---|---|---|
| EXAMPLE 1 | 0.25 | 0.75 | 0.15 | 0.7 | 0.6 | 1.0000 | EXISTING |
| EXAMPLE 2 | 0.10 | 0.75 | 0.15 | 0.7 | 0.6 | 1.0000 | EXISTING |
| EXAMPLE 3 | 0.35 | 0.75 | 0.15 | 0.7 | 0.6 | 1.0000 | EXISTING |
| EXAMPLE 4 | 0.25 | 0.50 | 0.15 | 0.7 | 0.6 | 1.0000 | EXISTING |
| EXAMPLE 5 | 0.25 | 0.80 | 0.15 | 0.7 | 0.6 | 1.0000 | EXISTING |
| EXAMPLE 6 | 0.25 | 0.75 | 0.07 | 0.7 | 0.6 | 1.0000 | EXISTING |
| EXAMPLE 7 | 0.25 | 0.75 | 0.25 | 0.7 | 0.6 | 1.0000 | EXISTING |
| EXAMPLE 8 | 0.25 | 0.75 | 0.15 | 0.6 | 0.6 | 1.0000 | EXISTING |
| EXAMPLE 9 | 0.25 | 0.75 | 0.15 | 0.9 | 0.6 | 1.0000 | EXISTING |
| EXAMPLE 10 | 0.25 | 0.75 | 0.15 | 0.7 | 0.5 | 1.0000 | EXISTING |
| EXAMPLE 11 | 0.25 | 0.75 | 0.15 | 0.7 | 0.7 | 1.0000 | EXISTING |
| EXAMPLE 12 | 0.25 | 0.75 | 0.15 | 0.7 | 0.6 | 0.9985 | EXISTING |
| EXAMPLE 13 | 0.25 | 0.75 | 0.15 | 0.7 | 0.6 | 1.0015 | EXISTING |
| COMPARATIVE EXAMPLE 1 | 0.01 | 0.75 | 0.15 | 0.7 | 0.6 | 1.0000 | NON |
| COMPARATIVE EXAMPLE 2 | 0.25 | 1.00 | 0.15 | 0.7 | 0.6 | 1.0000 | NON |
| COMPARATIVE EXAMPLE 3 | 0.25 | 0.75 | 0.50 | 0.7 | 0.6 | 1.0000 | NON |
| COMPARATIVE EXAMPLE 4 | 0.25 | 0.75 | 0.15 | 0.1 | 0.6 | 1.0000 | NON |
| COMPARATIVE EXAMPLE 5 | 0.25 | 0.75 | 0.15 | 0.7 | 0.1 | 1.0000 | NON |
| COMPARATIVE EXAMPLE 6 | 0.25 | 0.75 | 0.15 | 0.7 | 0.6 | 1.0020 | NON |

On the other hand, in the comparative examples 1 to 6, the spot 14 is found on none of the upper face, the lower face and the two side faces of the multilayer chip 10. It is thought that this was because the amount of V was a small value of 0.01 atm % in the comparative example 1, the amount of Si was a high value of 1.00 atm % in the comparative example 2, the amount of Mn was a high value of 0.50 atm % in the comparative example 3, the amount of Ho was a small value of 0.1 atm % in the comparative example 4, the amount of Mg was a small value of 0.1 atm % in the comparative example 5, and the A/B ratio was a high value of 1.0020 in the comparative example 6.

Although the embodiments of the present invention have been described in detail, it is to be understood that the various change, substitutions, and alterations could be made hereto without departing from the spirit and scope of the invention.

What is claimed is:

1. A ceramic electronic device comprising:
   a ceramic body that has a first face and a second face facing with the first face and has an internal electrode layer inside thereof;
   a pair of external electrodes that cover the first face and the second face; and
   a spot that is formed on a third face of the ceramic body that is different from the first face and the second face and is an amorphous phase including Ba, Si and O.

2. The ceramic electronic device as claimed in claim 1, wherein an average diameter of the spot on the third face is three times or more than an average crystal grain diameter of a main component ceramic of the third face.

3. The ceramic electronic device as claimed in claim 1, wherein an average diameter of the spot on the third face is 3 μm or more and 30 μm or less.

4. The ceramic electronic device as claimed in claim 1, wherein the spot is formed on the rest of the faces other than the first face and the second face of the ceramic body.

5. The ceramic electronic device as claimed in claim 4, wherein average diameters of the spot of two facing faces of the ceramic body are different from each other, the two facing faces being different from the first face and the second face.

6. The ceramic electronic device as claimed in claim 1, wherein the ceramic electronic device has an external size of a length of 0.25 mm±0.015 mm, a width of 0.125 mm 0.015 mm and a height of 0.125 mm±0.015 mm.

7. The ceramic electronic device as claimed in claim 1, wherein the ceramic electronic device has an external size in a longitudinal direction is 0.1 mm to 0.23 mm.

8. A testing device of ceramic electronic devices, each corresponding to the ceramic electronic device of claim 1, comprising:
- a storage storing a standard of the spot formed on the third face of the ceramic electronic device of claim 1;
- an imaging device capturing an image of an object ceramic electronic device for testing which corresponds to the ceramic electronic device of claim 1; and
- a testing unit testing the object ceramic electronic device by comparing the image captured by the imaging device with the standard stored in the storage.

9. A testing method of ceramic electronic devices, each corresponding to the ceramic electronic device of claim 1, comprising:
- storing a standard of a spot in a storage, the spot being formed on the third face of the ceramic electronic device of claim 1;
- capturing an image of a ceramic electronic device that is an object for testing and corresponds to the ceramic electronic device of claim 1, by an imaging device; and
- testing the ceramic electronic device for testing by comparing the image captured by the imaging device with the standard stored in the storage.

* * * * *

UNITED STATES PATENT AND TRADEMARK OFFICE
CERTIFICATE OF CORRECTION

| | |
|---|---|
| PATENT NO. | : 10,843,972 B2 |
| APPLICATION NO. | : 16/115279 |
| DATED | : November 24, 2020 |
| INVENTOR(S) | : Kazumi Kaneda |

Page 1 of 1

It is certified that error appears in the above-identified patent and that said Letters Patent is hereby corrected as shown below:

In the Claims

Column 13, Line 11, in Claim 6, a --±-- should be inserted between "0.125 mm" and "0.015 mm"

Signed and Sealed this
Twenty-third Day of March, 2021

Drew Hirshfeld
*Performing the Functions and Duties of the*
*Under Secretary of Commerce for Intellectual Property and*
*Director of the United States Patent and Trademark Office*